United States Patent [19]

Brandner et al.

[11] Patent Number: 4,927,084
[45] Date of Patent: May 22, 1990

[54] FUEL INJECTION VALVE

[75] Inventors: Burkhard Brandner, Werdohl; Klaus Wenzlik, Iserlohn, both of Fed. Rep. of Germany

[73] Assignee: Atlas Fahrzeugtechnik GmbH, Werdohl, Fed. Rep. of Germany

[21] Appl. No.: 291,946

[22] Filed: Dec. 28, 1988

[30] Foreign Application Priority Data

Jan. 7, 1988 [DE] Fed. Rep. of Germany ....... 3800203

[51] Int. Cl.⁵ .................. B05B 3/14; F16K 31/02; F02M 51/06
[52] U.S. Cl. .................. 239/584; 251/129.01; 310/317; 310/331
[58] Field of Search .................. 310/330, 331, 317; 251/129.01, 11; 239/102.2, 397.5, 4, 584

[56] References Cited

U.S. PATENT DOCUMENTS

| | | | |
|---|---|---|---|
| 3,093,760 | 6/1963 | Tarasevich | 310/331 |
| 3,360,664 | 12/1967 | Straube | 310/330 |
| 4,096,993 | 6/1978 | Behr | 251/11 |
| 4,140,936 | 2/1979 | Bullock | 310/331 |
| 4,268,006 | 5/1981 | Kunz et al. | 251/11 |
| 4,601,539 | 7/1986 | Watanabe | 310/331 |
| 4,669,660 | 6/1987 | Weber et al. | 239/102.2 |
| 4,739,929 | 4/1988 | Brandner et al. | 239/102.2 |

Primary Examiner—Andres Kashnikow
Assistant Examiner—Christopher G. Trainor
Attorney, Agent, or Firm—Peter K. Kontler

[57] ABSTRACT

A fuel injection valve wherein a reciprocable valving element is movable from closed to open position by a piezoceramic moving unit having at least two flexural resonators in the form of laminated packages of metallic carriers, ceramic layers and foil-shaped and/or ring-shaped conductors connected to the poles of an energy source in such a way that energization entails deformation of packages in opposite directions, namely the deformed packages have confronting concave or convex sides. This increases the distance which is covered by the valving element in response to energization of the packages.

17 Claims, 5 Drawing Sheets

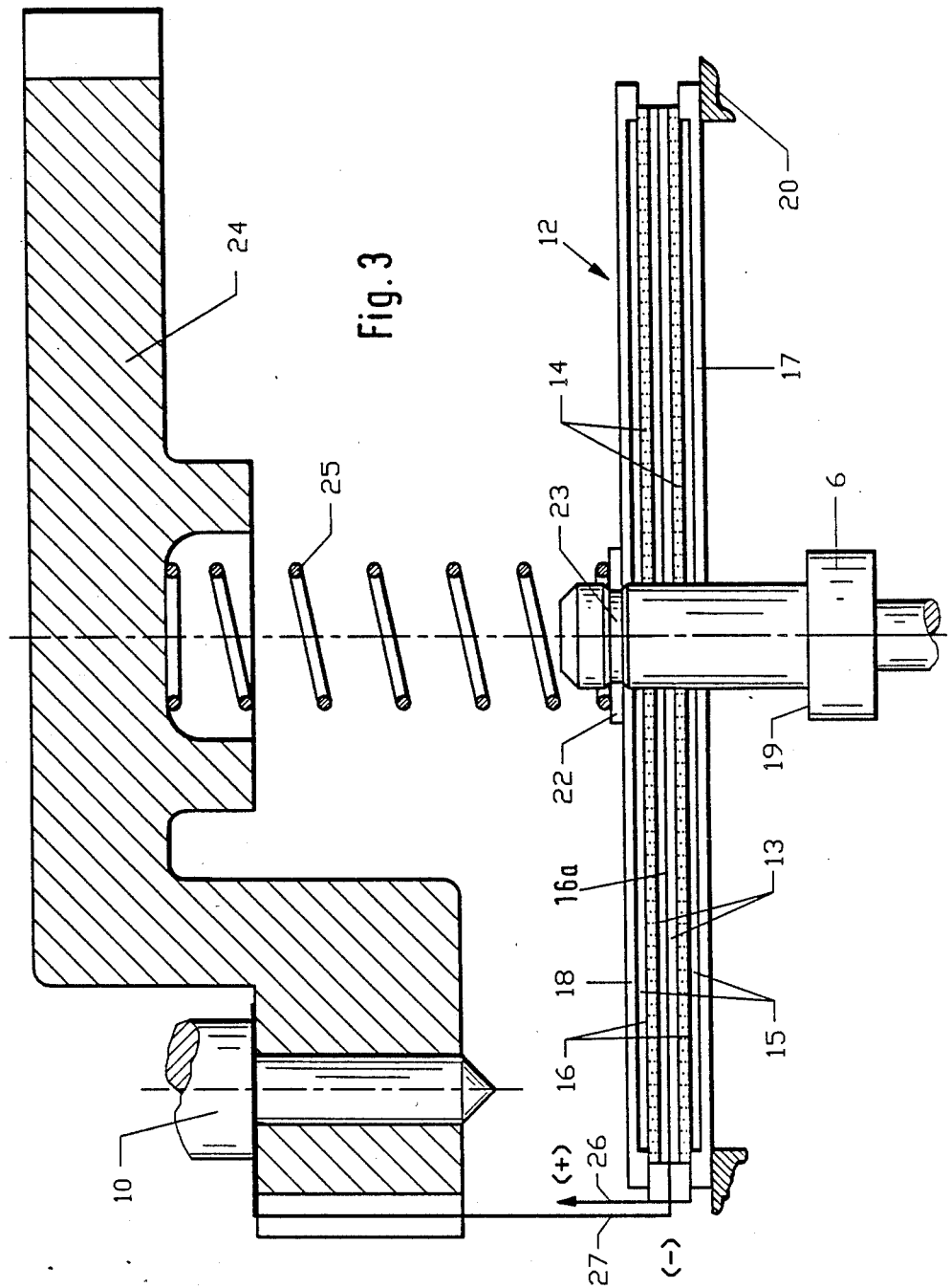

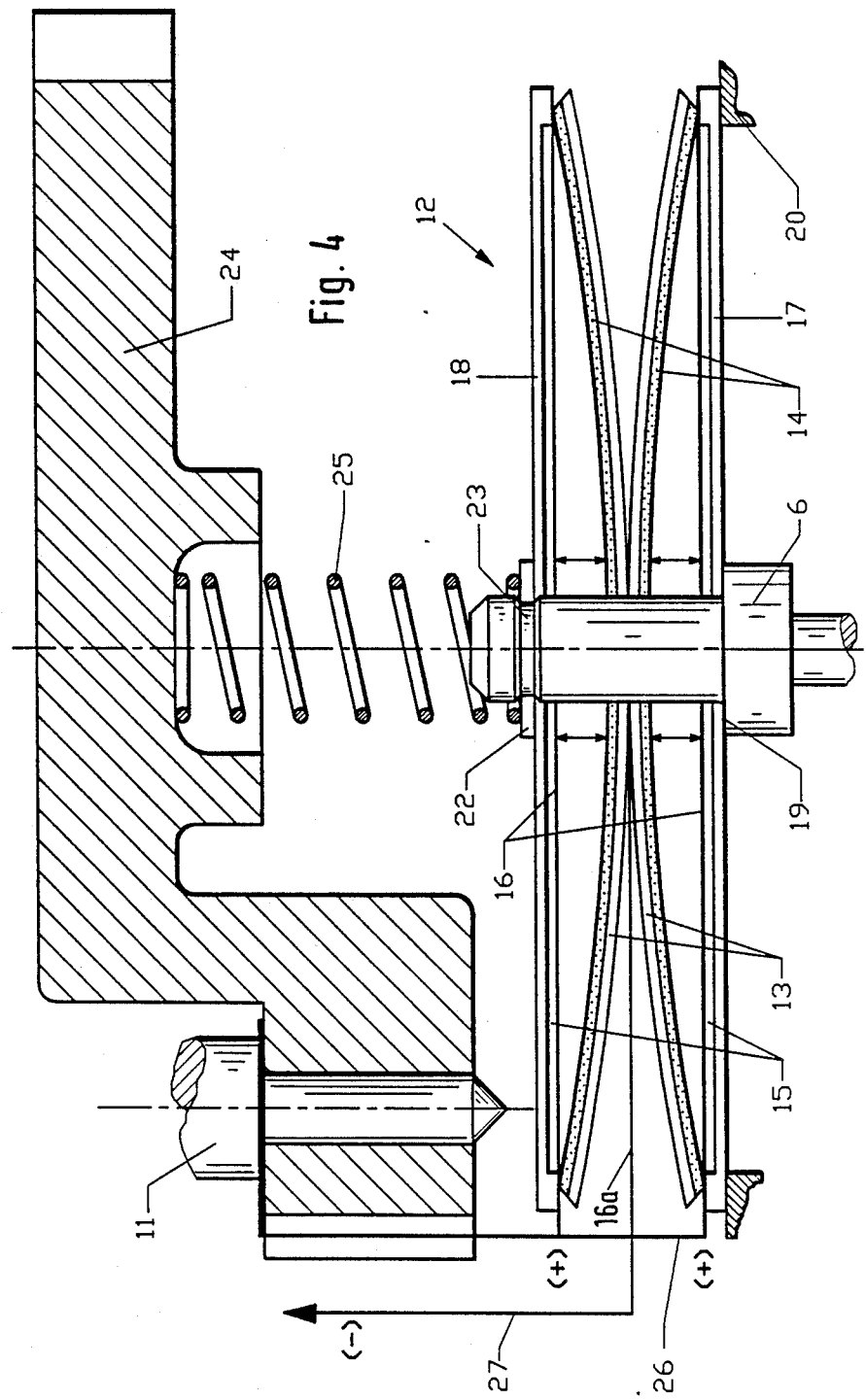

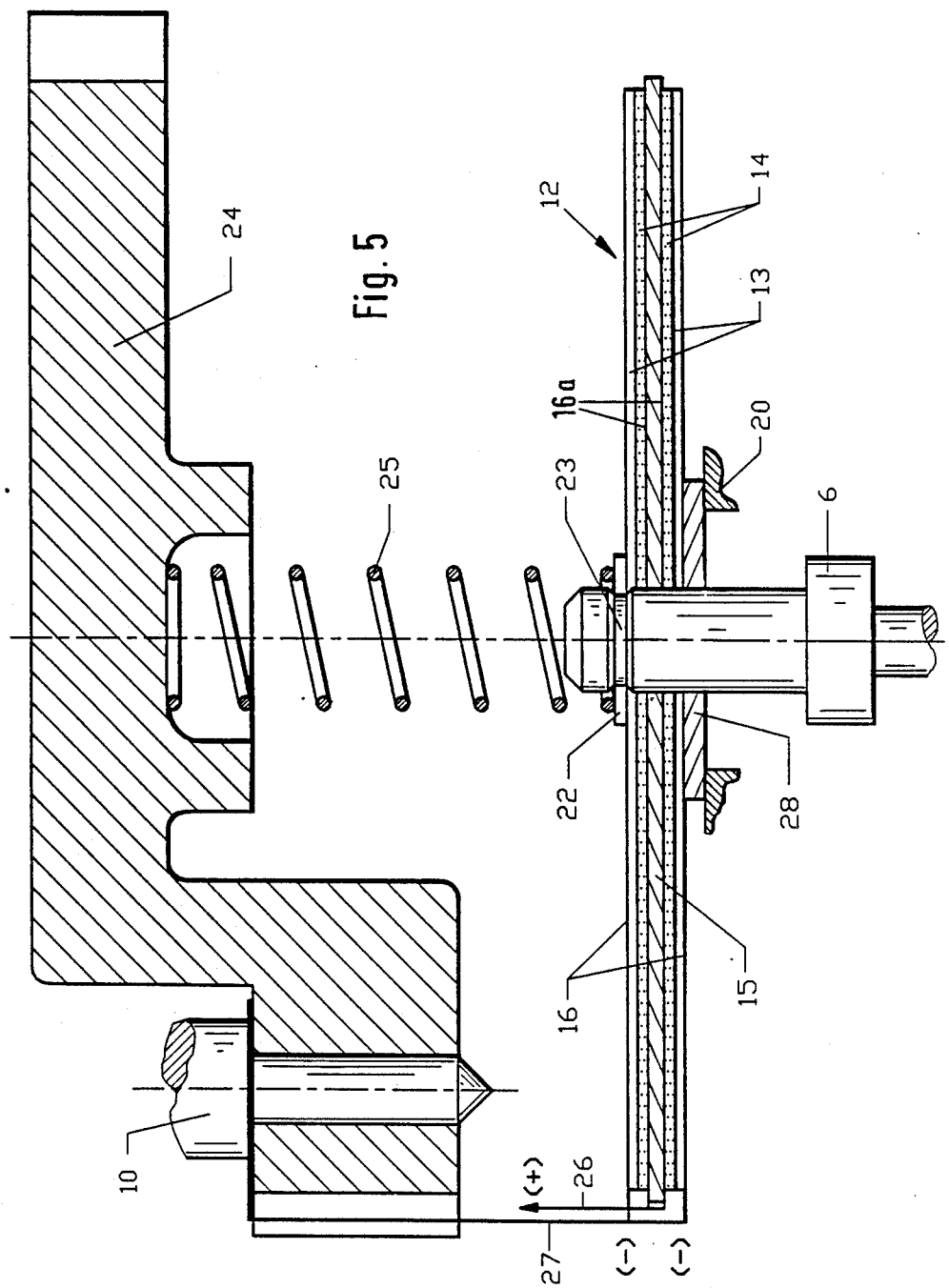

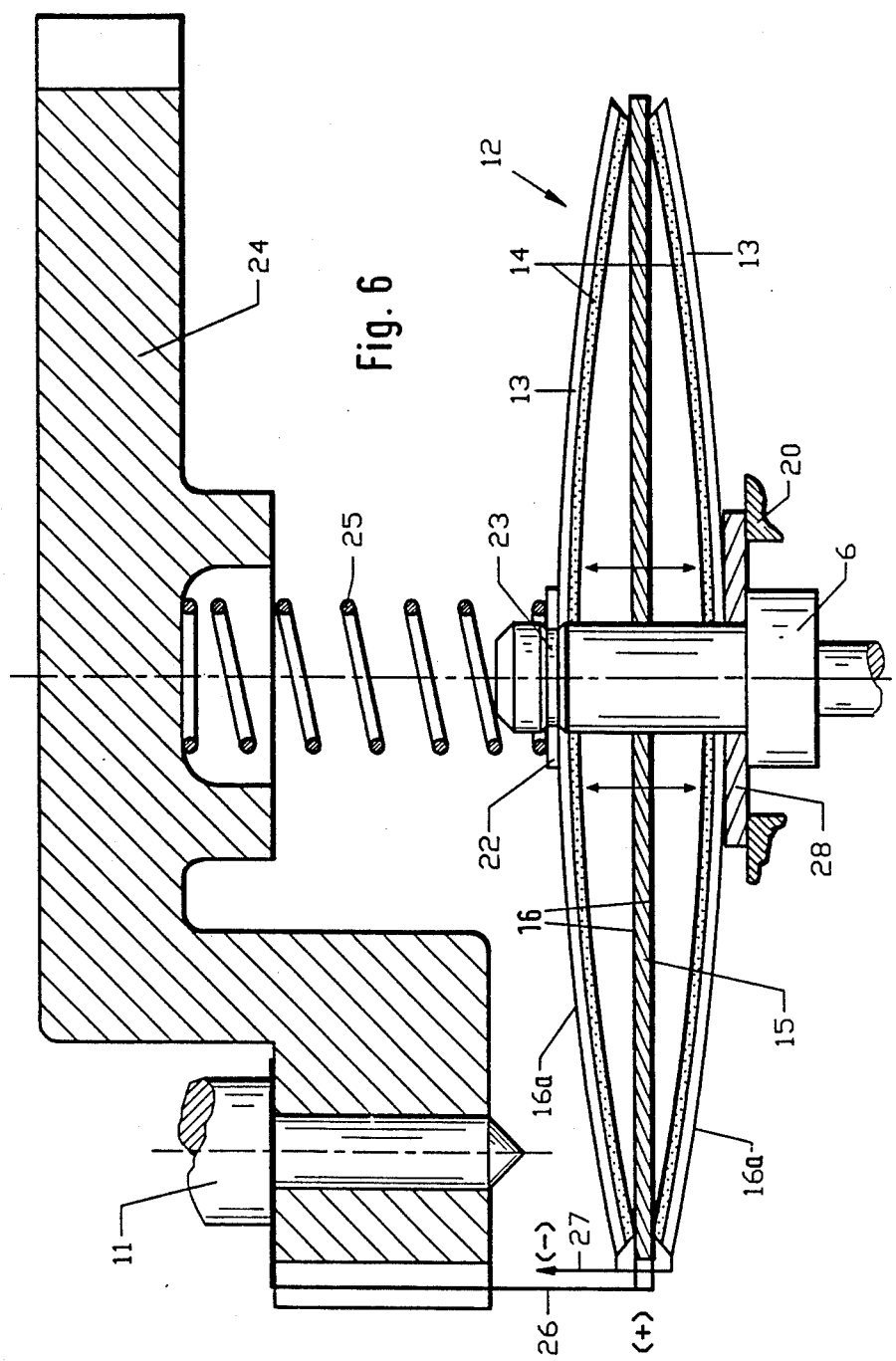

FUEL INJECTION VALVE

BACKGROUND OF THE INVENTION

The invention relates to improvements in valves of the type disclosed in commonly owned U.S. Pat. No. 4,739,929 granted Apr. 26, 1988 to Brandner et al., and in commonly owned published German patent application No. 35 32 660 of Brandner et al. More particularly, the invention relates to improvements in piezoceramic means for moving the valving elements in fuel injection valves and/or other types of valves in response to energization of their flexural resonators.

The published German patent application of Brandner et al. discloses a valve wherein the piezoceramic moving unit comprises a plurality of flexural resonators all of which are flexed in the same direction in response to energization so that they can move the valving element with a relatively large force. However, the distance which is covered by the valving element in response to energization of the resonators is rather short.

Published German patent application No. 24 02 085 discloses a valve moving unit which relies upon longitudinal resonators. Thus, the distances which are covered by individual resonators are totalized in response to energization to thus ensure that the valving element is moved through a greater distance. Neighboring resonators abut each other in energized and deenergized condition.

OBJECTS OF THE INVENTION

An object of the invention is to provide a valve, particularly a fuel injection valve, with novel and improved means for moving the valving element between two spaced-apart positions, for example, from closed to open position.

Another object of the invention is to provide a novel and improved piezoceramic moving unit for a valving element.

A further object of the invention is to provide a novel and improved array of flexural resonators which can move the valving element with a requisite force and can also cause the valving element to cover a considerable distance in response to energization of the resonators.

An additional object of the invention is to provide the piezoceramic moving unit with novel and improved means for transmitting motion to the valving element.

Still another object of the invention is to provide a novel and improved method of connecting the conductors of flexural resonators in circuit with an energy source.

A further object of the invention is to provide a valve which constitutes an improvement over the valve of published German patent application No. 35 32 660.

SUMMARY OF THE INVENTION

The invention is embodied in a valve, particularly a fuel injection valve, which comprises a housing, a valving element which is mounted in the housing and is movable between first and second positions, and piezoceramic means for moving the valving element from the first to the second position. The piezoceramic means includes at least two energizable laminated packages each of which is deformable in response to energization and each of which includes a ceramic layer having a first surface and a second surface, a plate-like carrier at one surface of the ceramic layer, first conductor means at the other surface of the ceramic layer, and second conductor means. The carrier of each package is disposed between the second conductor means and the respective ceramic layer, and the piezoceramic means further comprises an energy source having a first and a second pole, means for connecting one of the poles with the first conductor means of the packages, and means for connecting the second conductor means of the packages with the other pole.

If the second conductor means of the packages are disposed between the ceramic layers, energization of the packages entails such deformation of the packages that the packages develop concave and convex sides and the convex sides of the packages confront each other. The apices of the convex sides preferably abut each other. In such piezoceramic means, the second conductor means of one of the packages can be integral with the second conductor means of the other package, i.e., the two packages can be provided with common second conductor means. Such common conductor means can comprise a metallic ring between the apices of the convex sides of the two packages in energized condition of the packages.

The piezoceramic means can further comprise means for transmitting motion from the marginal portion of at least one of the packages to the valving element, the motion transmitting means can comprise first and second plates one of which is installed in the housing and the other of which is arranged to move away from the one plate in response to energization of the packages. The other plate has means for moving the valving element relative to the one plate (i.e., relative to the housing) in response to energization of the packages.

If the first conductor means are disposed between the ceramic layers of the packages, energization of the packages entails deformation of the packages such that the packages have concave sides confronting each other. Such packages have abutting marginal portions and one of the packages has a median portion including means for transmitting motion to the valving element so that the valving element moves relative to the other package in response to energization and resulting deformation of the packages. The housing can be provided with an abutment for the other package.

The valve preferably further comprises one or more springs or other suitable means for yieldably biasing the valving element to the first position. The valving element preferably comprises a shank which extends through openings in central portions of the packages.

Each of the conductor means can include or constitute a metallic foil.

The valve preferably further comprises a plate-like insulator adjacent each first conductor means, and each first conductor means is disposed between an insulator and the respective ceramic layer. A discrete insulator for each package will be provided if energization of the packages results in such deformation that the convex sides of the packages confront each other. If the energization entails a deformation resulting in confrontation of concave sides of the packages, a single insulator suffices because the first conductor means of the packages are then adjacent each other.

The piezoceramic means can comprise two or more pairs of laminated packages.

The novel features which are considered as characteristic of the invention are set forth in particular in the appended claims. The improved valve itself, however, both as to its construction and its mode of operation, together with additional features and advantages thereof, will be best understood upon perusal of the following detailed description of certain specific embodiments with reference to the accompanying drawing.

BRIEF DESCRIPTION OF THE DRAWING

FIG. 3 is an enlarged sectional view of a detail in the valve of FIGS. 1 and 2, showing the packages of the piezoceramic moving means in deenergized condition;

FIG. 4 shows the structure of FIG. 3, with the packages of the piezoceramic moving means in energized condition;

FIG. 5 is a view similar to that of FIG. 3 but showing modified piezoceramic moving means; and FIG. 6 illustrates the structure of FIG. 5, with the packages of the piezoceramic moving means in energized condition.

DESCRIPTION OF PREFERRED EMBODIMENTS

Figures 1, 2:
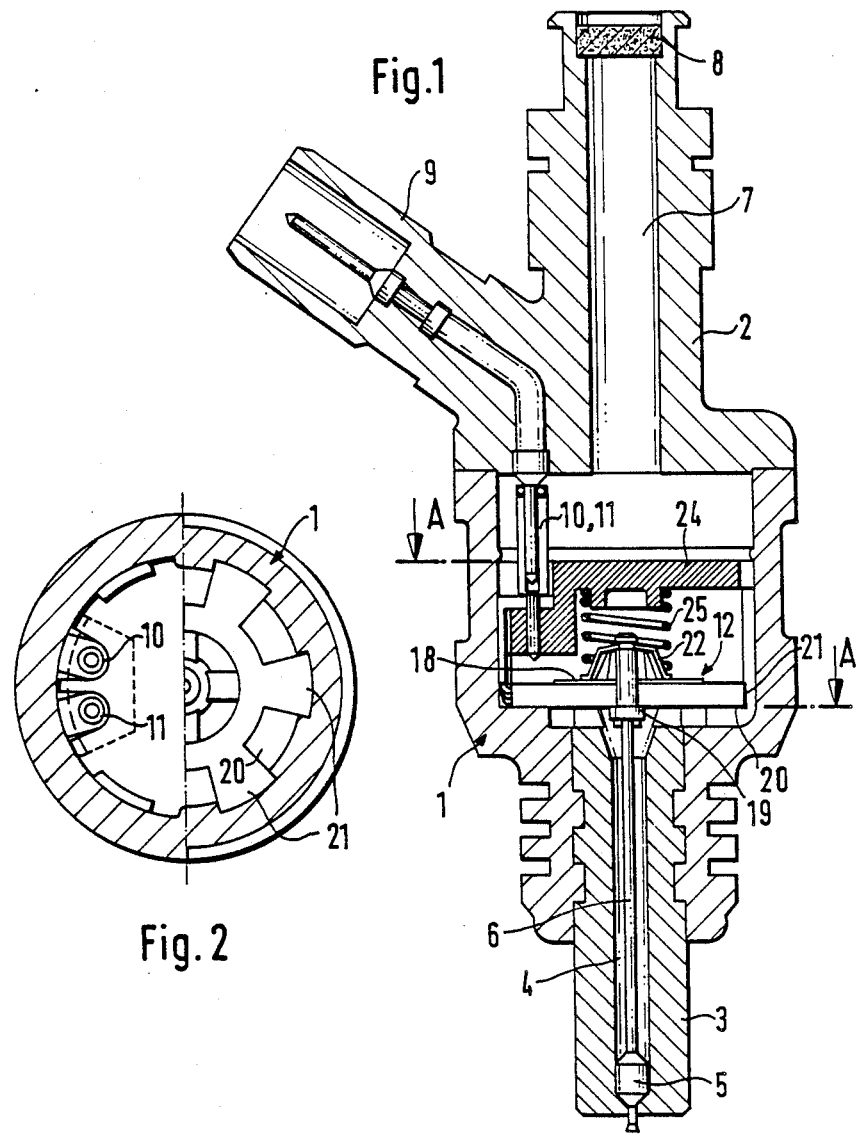
FIG. 1 is an axial sectional view of a valve which is designed for injection of fuel and embodies one form of the present invention.
FIG. 2 is a sectional view substantially as seen in the direction of arrows from the line A—A of FIG. 1.

The fuel injection valve which is shown in FIGS. 1 and 2 comprises a housing or body 1 having a cover 2 and a removable injector nozzle 3 defining an axially extending channel 4 for injection of fuel into the combustion chamber of a cylinder in an internal combustion engine, not shown. A valving element 5 is reciprocably mounted in the nozzle 3 for movement between a first (closed) position (shown in FIG. 1) in which the valving element engages a seat in the nozzle 3 and prevents the fuel from leaving the housing 1, and a second (inoperative or open) position in which the fuel can flow from a fuel supplying passage 7 in the cover 2 into and out of the channel 4. The valving element 5 has an elongated stem or shank 6 which extends into an internal chamber of the housing 1 between the cover 2 and the nozzle 3. The inlet of the passage 7 contains a filter 8 for fuel flowing from a pump (not shown) into the cover 2.

The cover 2 is integral with a plug-in connector 9 which can be said to constitute or form part of a source of electrical energy and is connected to a battery by a cable or the like, not shown. Two terminals 10, 11 of the connector 9 are connected to different poles of the battery.

The valve further comprises a novel and improved piezoceramic unit 12 which serves to move the valving element 5 from the first to the second position in response to energization of its laminated packages which are shown in detail in FIGS. 3 and 4. The piezoceramic unit 12 is installed in the chamber of the housing 1 adjacent the terminals 10, 11 and can be said to include the aforementioned energy source with two different poles as well as at least two laminated packages each having a metallic plate-like carrier 13, a ceramic layer 14, a first conductor foil 16 and a second conductor foil 16a. As can be seen in FIGS. 3 and 4, each plate-like carrier 13 is adjacent one surface of the respective ceramic layer 14, and each conductor 16 is adjacent the other surface of the respective ceramic layer 14. The conductor 16a of the upper package of FIGS. 3 and 4 constitutes the conductor 16a of the lower package. Each carrier 13 is disposed between the conductor 16a and the respective ceramic layer 14. Each of the two packages can be said to constitute a flexural resonator which undergoes predetermined deformation in response to energization, i.e., in response to completion of the circuit including the terminals 10, 11.

The piezoceramic unit 12 further comprises two plate-like motion transmitting members 17, 18 which engage the marginal portions of the respective packages. The rim of the lower motion transmitting member 17 of FIGS. 3-4 rests on an annular shoulder 20 of the housing 1 and has a central opening for the shank 6 of the valving element 5. This shank extends through the two packages of the piezoceramic unit 12 and has a shoulder 19 which can limit the extent of movement of the valving element 5 in that it abuts the underside of the motion transmitting member 17 when the packages are deformed and the member 18 causes the shank 6 to move relative to the member 17, i.e., relative to the housing 1. The latter defines channels 21 which alternate with portions of the shoulder 20 and establish paths for the flow of fuel from the passage 7 of the cover 2 in the channel 4 of the fuel injection nozzle 3. The inner sides of the motion transmitting members 17, 18 are adjacent the respective conductor foils 16, and the central portion of the member 18 abuts the underside of an elastic washer 22 extending into a circumferential groove 23 of the shank 6 and being biased downwardly by a coil spring 25 serving as a means for yieldably biasing the valving element 5 to the first position of FIG. 1. The topmost convolution of the coil spring 25 (as seen in FIGS. 1, 3 and 4) reacts against a plate-like support 24 in the internal chamber of the housing 1. The washer 22 serves to maintain the carriers 13, the ceramic layers 14, the conductors 16 and the conductor 16a in contact with each other as shown in FIG. 3.

The means for connecting the terminal 11 with the conductors 16 comprises lugs 26 which are connected with the positive pole of the energy source by way of the terminal 11. The terminal 10 is connected to the negative pole of the energy source and to a lug 27 of the conductor 16a. The terminals 10, 11 are fixedly mounted in the support 24. The arrangement is preferably such that the lug 27 is angularly offset with reference to the lugs 26.

The conductor foil 16a can be replaced with a metallic ring (not shown) which surrounds the shank 6 of the valving element 5 and contacts the central portions of the two carriers 13. A small-diameter ring suffices because, when the packages are energized (see FIG. 4), only the central portions of the carriers 13 (at the apices of the then convex confronting sides of the two packages) actually contact each other.

FIG. 3 shows that the two packages of the piezoceramic moving unit 12 are flat and immediately adjacent each other when the packages are deenergized. This enables the spring 25 to maintain the valving element 5 in its first position in which the shoulder 19 of the shank 6 is spaced apart from the lower package and from the motion transmitting member 17.

When the packages of the piezoceramic moving means 12 are energized, they undergo deformation resulting in conversion into concavo-convex bodies whereby the convex sides of the two packages confront each other and the apices of the concave sides actually contact one another. The reason is that deformation of the two packages entails a movement of the motion transmitting member 18 away from the member 17 (the latter abuts the shoulder 20 of the housing 1 and, therefore, cannot move toward the nozzle 3) whereby the central portion of the member 18 pushes the washer 22 upwardly, i.e., the shank 6 moves toward the support 24 and the washer 22 causes the coil spring 25 to store energy. The valving element 5 is lifted off its seat and permits a metered quantity of fuel to issue from the orifice of the nozzle 3.

It will be noted that two oppositely polarized packages enable the valving element 5 to cover a distance twice that which would be covered under the action of a single package and twice that achievable with two or more packages which are deformed in the same direction (so that the concave side of one package is adjacent the convex side of another package). The extent of axial displacement of the valving element 5 can be increased by placing two additional packages and a motion transmitting member 17 between the upper package of FIGS. 3-4 and the member 18.

The reference characters 15 denote two plate-like insulators one of which is disposed between the lower conductor foil 16 and the motion transmitting member 17, and the other of which is installed between the upper conductor foil 16 and the motion transmitting member 18.

FIGS. 5 and 6 show a modified piezoceramic moving unit 12 for the shank 6 of the valve 5. This unit comprises a single plate-like insulator 15 which is flanked by the two conductor foils 16. The foils 16 have lugs 26 for connection to the positive terminal 11, and the conductor foils 16a (at the outer sides of the carriers 13) have lugs 27 which are connected to the negative terminal 10. In this embodiment of the piezoceramic moving unit, the ceramic layers 14 are disposed between the two carriers 13, and the carriers 13 are disposed between the conductor foils 16a. The conductor foils 16 are disposed between the ceramic layers and flank the plate-like insulator 15. The latter is acted upon by the marginal portions of the two packages when the packages are energized. At such time, the concave sides of the two packages confront each other. The underside of the median portion of the lower package then bears against a washer-like motion transmitting member 28 which is made of insulating material and overlies an internal shoulder 20 of the housing, and the central portion of the upper package then bears against the washer 22 which extends into the groove 23 of the shank 6 and is biased downwardly by the coil spring 25, the same as in the valve of FIGS. 1 to 4.

The two packages are flat and immediately adjacent each other in deenergized condition which is shown in FIG. 5. When energized, the packages undergo deformation (see FIG. 6 whereby the concave sides of the two packages confront each other and the shank 6 is lifted to cause the spring 25 to store energy because the central portion of the upper package moves away from the central portion of the lower package (the central portion of the lower package cannot move downwardly because it abuts the member 28 which, in turn, abuts the shoulder 20 of the housing.

An important advantage of the improved valve is that a relatively small number of packages in the piezoceramic moving unit suffices to move the valving element through a considerable distance. This is achieved by proper selection of polarities of first and second conductors so as to ensure that the deformation of one of the packages is counter to that of the other packages in each pair of cooperating packages, i.e., if one of the packages bulges toward the nozzle 3, the other package bulges toward the cover 2 and, if one package bulges toward the other package, the other package bulges towards the one package. The convex sides of the two packages confront each other when the marginal portions of deformed packages are called upon to shift the shank 6 of the valving element. If the valving element is to be shifted by the central portions of the packages, energization of the packages must entail a deformation such that one concave sides of the packages confront one another.

An advantage of the aforementioned metallic ring which can be used in lieu of the foil 16a in the piezoceramic unit of FIGS. 3-4 is that it can stand much longer periods of than a conductor which constitutes a thin foil conductor 16 in the embodiment of FIGS. 5 and be replaced with a metallic ring which surround respective portion of the shank 6.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the appended claims.

We claim:

1. A valve, particularly a fuel injection valve, comprising a housing; a valving element mounted in said housing and being movable between first and second positions; and piezoceramic means for moving said valving element from said first to said second position, including at least two energizable laminated packages each of which is deformable in response to energization and each including a ceramic layer having a first surface and a second surface, a plate-like carrier at one surface of the ceramic layer, first conductor means at the other surface of the ceramic layer, and second conductor means, the carrier being disposed between the second conductor means and the ceramic layer, said second conductor means of said packages being disposed between said ceramic layers so that energization of said packages entails deformation of said packages such that the packages have convex sides confronting each other, said piezoceramic means further comprising an energy source having first and second poles, means for connecting one of said poles to the first conductor means of said packages, and means for connecting the second conductor means with the other of said poles.

2. The valve of claim 1, wherein said convex sides have apices abutting each other.

3. The valve of claim 1, wherein the second conductor means of one of said packages is integral with the second conductor means of the other of said packages.

4. The valve of claim 1, wherein said second conductor means includes a metallic ring.

5. The valve of claim 1, wherein said packages have marginal portions and said moving means further comprises means for transmitting motion from at least one of said marginal portions to said valving element.

6. The valve of claim 5, wherein said motion transmitting means includes first and second plates, one of said plates being installed in said housing and the other of said plates being arranged to move away from said one plate in response to energization of said packages, said other plate having means for moving said valving element relative to said one plate.

7. The valve of claim 1, further comprising means for yielding biasing said valving element to said first position.

8. The valve of claim 1, wherein said valving element includes a shank and said packages have substantially centrally located openings for said shank.

9. The valve of claim 1, wherein each of said conductor means includes a metallic foil.

10. The valve of claim 1, further comprising a plate-like insulator adjacent each first conductor means, each of said first conductor means being disposed between an insulator and the respective ceramic layer.

11. A valve, particularly a fuel injection valve, comprising a housing; a valving element mounted in said housing and being movable between first and second positions; and piezoceramic means for moving said valving element from said first to said second position, including at least two energizable laminated packages each of which is deformable in response to energization and each including a ceramic layer having a first surface and a second surface, a plate-like carrier at one surface of the ceramic layer, first conductor means at the other surface of the ceramic layer, and second conductor means, the carrier being disposed between the second conductor means and the ceramic layer and said first conductor means being disposed between the ceramic layers of said packages so that energization of said packages entails deformation of said packages such that the packages have concave sides confronting each other, said piezoceramic means further comprising an energy source having first and second poles, means for connecting one of said poles to the first conductor means of said packages, and means for connecting the second conductor means with the other of said poles.

12. The valve of claim 11, wherein said packages have abutting marginal portions and one of said packages has a median portion including means for transmitting motion to said valving element so that the valving element moves relative to the other of said packages in response to energization and resulting deformation of said packages.

13. The valve of claim 12, wherein said housing has an abutment for said other package.

14. The valve of claim 11, further comprising a plate-like insulator between the first conductor means of said packages.

15. The valve of claim 11, further comprising means for yieldably biasing said valving element to said first position.

16. The valve of claim 11, wherein said valving element includes a shank and said packages have substantially centrally located openings for said shank.

17. The valve of claim 11, wherein each of said conductor means includes a metallic foil.

* * * * *